United States Patent
Wada et al.

(10) Patent No.: US 6,787,989 B2
(45) Date of Patent: Sep. 7, 2004

(54) SUBSTRATE WITH TRANSPARENT CONDUCTIVE FILM AND ORGANIC ELECTROLUMINESCENCE DEVICE USING THE SAME

(75) Inventors: Shunji Wada, Sagamihara (JP); Yukihiro Kato, Sagamihara (JP)

(73) Assignee: Nippon Sheet Glass Co., Ltd. (JP)

( * ) Notice: Subject to any disclaimer, the term of this patent is extended or adjusted under 35 U.S.C. 154(b) by 0 days.

(21) Appl. No.: 09/820,385

(22) Filed: Mar. 29, 2001

(65) Prior Publication Data
US 2002/0014833 A1 Feb. 7, 2002

(30) Foreign Application Priority Data
Jun. 21, 2000 (JP) ........................................ 2000-186106

(51) Int. Cl.⁷ ......................... H05B 33/00; H05B 33/14
(52) U.S. Cl. ....................... 313/504; 313/503; 313/505; 313/506; 313/498; 428/37; 428/38; 428/42; 428/47; 428/66
(58) Field of Search ................................. 313/504, 502, 313/503, 505, 506, 498; 428/690; 427/37, 38, 42, 47, 66

(56) References Cited

U.S. PATENT DOCUMENTS

| | | | | |
|---|---|---|---|---|
| 5,009,922 A | * | 4/1991 | Harano et al. .............. | 427/571 |
| 5,180,476 A | * | 1/1993 | Ishibashi et al. ........ | 204/192.29 |
| 5,247,226 A | * | 9/1993 | Sato et al. .................. | 313/504 |
| 5,399,936 A | * | 3/1995 | Namiki et al. .............. | 313/504 |
| 5,719,467 A | * | 2/1998 | Antoniadis et al. ......... | 313/502 |
| 5,739,635 A | * | 4/1998 | Wakimoto .................. | 313/498 |
| 5,886,464 A | * | 3/1999 | Shi et al. .................... | 252/582 |
| 6,133,581 A | * | 10/2000 | Terao et al. .................. | 257/40 |
| 6,239,453 B1 | * | 5/2001 | Yamada et al. ............... | 257/79 |
| 6,259,202 B1 | * | 7/2001 | Sturm et al. ................ | 313/504 |
| 6,262,441 B1 | * | 7/2001 | Bohler et al. ............... | 257/103 |
| 6,316,343 B1 | * | 11/2001 | Wada et al. ................ | 438/584 |
| 6,322,910 B1 | * | 11/2001 | Arai et al. ............. | 252/301.16 |

FOREIGN PATENT DOCUMENTS

| JP | 09003628 A | * | 1/1997 | ........... C23C/14/08 |
|---|---|---|---|---|
| JP | 2000128698 A | * | 5/2000 | ........... C30B/29/22 |

\* cited by examiner

Primary Examiner—Vip Patel
Assistant Examiner—Sikha Roy
(74) Attorney, Agent, or Firm—Rossi & Associates

(57) ABSTRACT

A substrate with a transparent condcutive film is provided, which has a high work function and an excellent surface smoothness as well as a reduced specific resistance to thereby ensure a reduced power consumption and enhanced display quality. An ITO film 2 is formed on a glass substrate 1 by an ion plating method by using an ITO sintered compact with an $SnO_2$ content of 4 to 6 wt %. The ITO film 2 obtained as above has a surface having a work function of 4.9 to 5.5 eV, a surface roughness of 1 to 10 nm, and a specific resistance of $1.6 \times 10^{-4}$ $\Omega \cdot cm$ or less. An organic EL device using the substrate is provided, in which an organic multilayer film (hole transport layer 5, light-emitting layer 7, and electron transport layer 6) is laminated on the surface of the ITO film 2, and further a metal thin film layer 4 is laminated on the surface of the organic multilayer film.

4 Claims, 2 Drawing Sheets

SUBSTRATE WITH TRANSPARENT CONDUCTIVE FILM AND ORGANIC ELECTROLUMINESCENCE DEVICE USING THE SAME

BACKGROUND OF THE INVENTION

1. Field of the Invention

This invention relates to a substrate with a transparent conductive film and an organic electroluminescence (hereinafter referred to as "EL") device using the same, and more particularly to a substrate with a transparent conductive film, which is used as an electrode (anode) of an EL display device, and an organic EL device having an organic multilayer film laminated on a surface of the transparent conductive film.

2. Prior Art

The organic EL device is a display device which has an organic multilayer film comprised of a hole transport layer, a light-emitting layer, and an electron transport layer, interposed between an anode and a cathode, for carrying out an electric charge injection/recombination-based light-emitting operation. Recently, the organic EL device has been actively researched and developed in view of its advantageous features as a display device, i.e. a lower driving voltage and a wide range of possible luminescent colors which can be realized due to the variety of organic materials available therefor.

In an organic EL device of this kind, holes injected from the anode and electrons injected from the cathode travel through the hole transport layer and the electron transport layer to the light-emitting layer where the holes and the electrons are recombined to perform a light-emitting operation. As the cathode, a metal material, such as aluminum (AL) is employed, and as the anode, indium tin oxide (hereinafter referred to as "ITO") is employed, which has an excellent transparency and a low electrical resistance.

In the organic EL device of the above-mentioned kind, when holes are injected from the anode into the light-emitting layer, the holes move from the anode to the hole transport layer across an energy barrier between the anode and the hole transport layer. The work function of an ordinary ITO film, however, is by far smaller than the ionization potential Ip of the hole transport layer (the ionization potential Ip of the hole transport layer is normally 5.5 to 5.6 eV whereas the work function of the surface of the ITO film formed by a sputtering method is 4.2 to 4.7 eV), so that the balance of injection into the light-emitting layer between injected holes and injected electrons is lost, resulting an increase in the driving voltage. Therefore, to attain a reduced driving voltage, it is necessary to enhance the efficiency of injection of holes into the hole transport layer, and to this end, the energy barrier between the anode and the hole transport layer is required to be minimized.

Further, in the organic EL device, if the transparent conductive film as the anode has a large surface roughness (difference in height between protruding portions and recessed portions), a high electric field can be concentratedly applied to protruding portions of the surface. This causes a slight electric discharge to occur at the protruding portions, and therefore makes the device prone to a breakdown to form dark points from which light is no longer emitted. In short, the durability of the organic EL device is degraded. Therefore, the transparent conductive film is required to have a minimized surface roughness, i.e. an excellent smoothness.

To meet the above requirements, there has been proposed a technique by Japanese Laid-Open Patent Publication (Kokai) No. 8-167479 (hereinafter referred to as "the first prior art"), which carries out annealing on an ITO film formed as a transparent conductive film to obtain a smooth surface on the ITO film, and then subjects the resulting surface to further annealing or plasma processing, thereby increasing the work function of the ITO film to reduce the energy barrier between the anode and the hole transport layer.

More specifically, in the first prior art, after depositing amorphous particles formed of ITO onto the substrate, annealing is carried out within a temperature range of 100 to 500° C. under a non-oxidizing atmosphere, thereby causing crystal growth of the particles such that the ITO film has a surface roughness of 10 nm or less. Further, annealing is effected on the surface within a temperature range of 100 to 500° C. under an oxidizing atmosphere or a plasma is irradiated onto the surface, to make the work function of the surface of the ITO film larger than that of an ordinary ITO film, whereby the energy barrier between the anode and the hole transport layer of the ITO film is reduced.

In the first prior art, however, although the work function of the ITO film can be increased and the surface roughness can be reduced to a level of 10 nm or less to obtain a good smoothness, the film exhibits a high specific resistance of $2 \times 10^{-4}$ Ω·cm or higher, since the ITO film is formed by the sputtering method.

More specifically, differently from a voltage driven device, such as a crystal display device, the organic EL device, which is a current driven device, is susceptible resistance in power consumption and display quality to the wiring. To avoid this, it is necessary to reduce the resistance of the transparent conductive film (ITO film) as the anode, and to this end, it is required to minimize the specific resistance of the ITO film. However, the ITO film according to the above first prior art, which is formed by the conventional sputtering method, has a high specific resistance, which not only causes a large power loss of an organic EL device using the ITO film owing to a high wiring resistance, resulting in an increase in the power consumption, but also degrades display quality, which makes the ITO film difficult to be applied to today's EL devices of which capability of displaying high-precision images is demanded.

Further, the above first prior art is disadvantageous in that the film manufacturing process is complicated since a post treatment, such as annealing, is required.

As another conventional technique, there has been proposed a method of adding a metal oxide having a high work function, such as ruthenium oxide, molybdenum oxide or vanadium oxide, to ITO (Japanese Laid-Open Patent Publication (Kokai) No. 2000-72526; hereinafter referred to as "the second prior art").

The second prior art adds the above-mentioned metal oxide which has a higher work function than that of the ordinary ITO, to ITO to thereby increase the work function of the surface of an ITO film as a transparent conductive film. This enables reduction of the energy barrier between the anode and the hole transport layer.

The second prior art, however, has the disadvantage of increased manufacturing costs due to the use of a special and expensive metal oxide, such as ruthenium oxide or molybdenum oxide, which is added to the ITO. Moreover, similarly to the first prior art, the second prior art employs the sputtering method in forming the ITO film, which therefore only has a specific resistance of $7 \times 10^{-4}$ Ω·cm or higher.

Similarly to the first prior art, this results in increased power consumption and degraded display quality. This makes the ITO film produced by the second prior art difficult to be put to practical use in a high-precision EL display device.

Still another conventional technique has also been proposed which forms an ITO film into a bilayer structure, whereby one ITO film at an interface side in contact with a hole transport layer has an increased work function (Japanese Laid-Open Patent Publication (Kokai) No. 2000-68073; hereinafter referred to as "the third prior art").

The third prior art attempts to obtain an improved hole injection characteristic, by changing the oxygen partial pressure during a film forming process for forming an ITO film by the sputtering method, so that the ionization potential Ip, i.e. the work function of the interface portion of the ITO film is made closer to the ionization potential Ip of the hole transport layer.

More specifically, the third prior art changes the oxygen partial pressure during the film forming process, thereby forming an ITO film having a bilayer structure comprised of two layers having respective different ionization potentials Ip. However, similarly to the first prior art and the second prior art, the third prior art as well forms an ITO film by the sputtering method, and hence the ITO film has a high specific resistance, resulting in increased power consumption and degraded display quality. Therefore, this ITO film also suffers from the problem that it is difficult to put the same to practical use in a high-precision EL display device.

SUMMARY OF THE INVENTION

It is an object of the invention to provide a substrate with a transparent conductive film, which has a high work function and an excellent surface smoothness as well as a reduced specific resistance to thereby ensure a reduced power consumption and enhanced display quality, and an organic EL device using the same.

It is desirable that a transparent conductive film used in an organic EL device as an anode should have characteristics of a high work function, an excellent surface smoothness, and a decreased specific resistance for reducing power consumption and enhancing display quality.

However, if the sputtering method is employed to form an ITO film as in the prior art techniques described above, it is required to heat the glass substrate to a temperature as high as 300° C. or higher to obtain an ITO film having a desired low specific resistance. Moreover, in this case, to ensure excellent reproducibility of the film formation, it is necessary to form the ITO film at a very low film-forming speed, which results in poor mass productivity. Further, the ITO film formed as above by heating the glass substrate to a temperature as high as 300° C. or higher has a surface roughness of 30 nm or larger.

On the other hand, in the case of forming a transparent conductive film on a transparent substrate by the conventional sputtering method, so far as the work function and the surface roughness are concerned, it is possible to achieve values of these characteristics satisfactory to some extent. However, it is difficult to mass-produce transparent conductive films having a low specific resistance of $1.6 \times 10^{-4}$ $\Omega \cdot cm$ or less on an industrial scale, and hence difficult to reduce power consumption and enhance display quality.

In view of the above circumstances, the present inventors have made intensive studies and reached a finding that if a sintered compact of ITO as a transparent conductive material with a tin oxide ($SnO_2$) content of 4 to 6 wt % is employed as a material to be vaporized, and a transparent conductive film is formed on a transparent substrate by an ion plating method, it is possible to obtain a substrate with a transparent conductive film, for use with an organic EL device, which satisfies all the requirements of characteristics, such as work function, smoothness, and specific resistance.

The present invention is based on the above finding, and provides a substrate with a transparent conductive film comprising a transparent substrate, a transparent conductive film formed on a surface of the transparent substrate, wherein the transparent conductive film has a work function of 4.9 to 5.5 eV, a surface roughness of 1 to 10 nm, and a specific resistance of $1.6 \times 10^{-4}$ $\Omega \cdot cm$ or less. It is preferable that the transparent conductive film is formed on the surface of the transparent substrate by an ion plating method by using indium tin oxide which is a mixture of tin oxide and indium oxide as a material to be vaporized, and the indium tin oxide has a tin oxide content of 4 to 6 wt %.

When the above substrate with the transparent conductive film is used as a substrate in an organic EL device, it is possible to secure an increased efficiency of injection of holes into a hole transport layer (hole injection efficiency), an excellent smoothness, and further a reduced wiring resistance. Moreover, the substrate with the transparent conductive film, which is also excellent in productivity, can be obtained without carrying out a complicated post treatment.

Further, by laminating an organic multilayer film onto a surface of the transparent conductive film which has a high work function, an excellent smoothness, and a low specific resistance, it is possible to obtain an organic EL device which is reduced in driving voltage, and enhanced in durability and display quality with reduced power consumption.

That is, the organic EL device according to the present invention is characterized in that a multilayer film including a hole transport layer formed of an organic material is laminated on a surface of the transparent conductive film of the substrate with the transparent conductive film.

According to this organic EL device, the multilayer film including the hole transport layer formed of an organic material is laminated on the surface of the transparent conductive film, so that it is possible to decrease an energy barrier between the hole transport layer and the transparent conductive film, and reduce the driving voltage to 20 V or less. At the same time, the excellent smoothness of the transparent conductive film can improve durability, and the low specific resistance of the same reduces power loss, thereby making it possible to obtain a high display quality at a reduced power consumption. That is, all the requirements of the characteristics for the organic EL device can be satisfied.

Further, the ionization potential Ip of the hole transport layer is generally 5.5 to 5.6 eV. Therefore, when an organic EL device is produced by using the substrate with the transparent conductive film, the energy barrier between the hole transport layer and the transparent conductive film is reduced to 0.7 eV or less, thereby making it possible to increase the hole injection efficiency of injection of holes from the anode into the hole transport layer. This enables the reduction of the driving voltage.

Therefore, it is preferred that the energy barrier between the transparent conductive film and the hole transport layer is equal to or smaller than 0.7 eV.

The above and other objects, features, and advantages of the invention will become more apparent from the following detailed description taken in conjunction with the accompanying drawings.

DETAILED DESCRIPTION OF PREFERRED EMBODIMENT

The present invention will now be described in detail with reference to the drawings showing an embodiment thereof.

Figure 1:
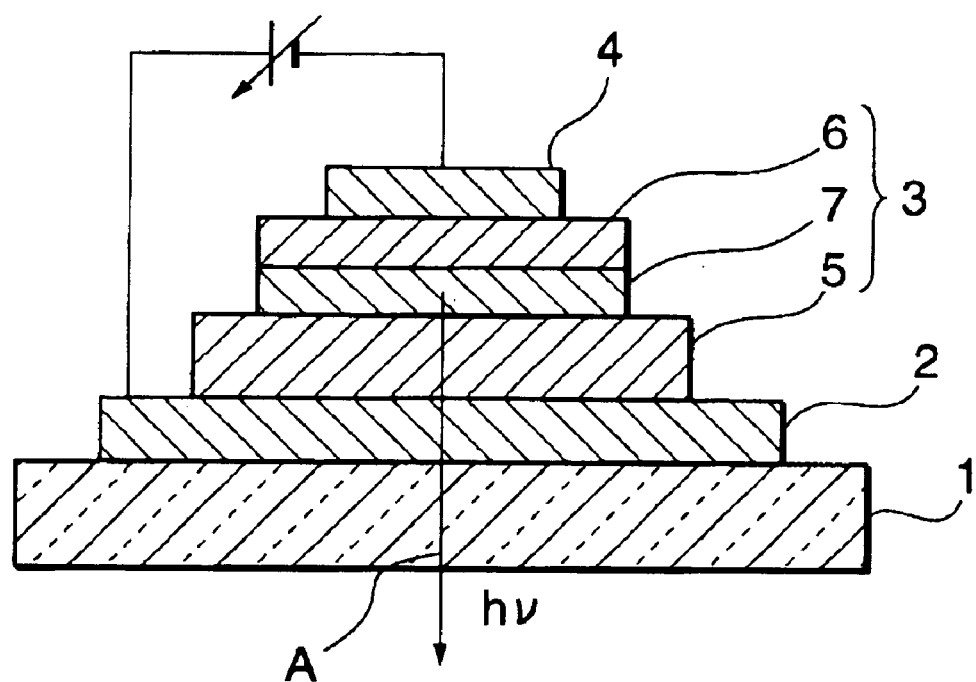
FIG. 1 is a cross-sectional view schematically showing the structure of an organic EL device according to the present invention.

FIG. 1 is a cross-sectional view schematically showing the structure of an organic EL device according to the invention.

In the figure, reference numeral 1 designates a glass substrate made of soda lime silicate or the like. This glass substrate 1 has a surface thereof laminated with an ITO film 2 as a transparent conductive film, and the ITO film 2 has a surface thereof laminated with an organic multilayer film 3. Further, the organic multilayer film 3 has a surface thereof laminated with a metal thin film layer 4.

The organic multilayer film 3 is comprised of a hole transport layer 5 for transporting holes from the ITO film 2, an electron transport layer 6 for transporting electrons from the metal thin film layer 4, a light-emitting layer 7 interposed between the electron transport layer 6 and the hole transport layer 5. The hole transport layer 5, the electron transport layer 6, and the light-emitting layer 7 are all formed of organic materials.

More specifically, as an organic material forming the hole transport layer 5 can be used triphenyldiamine or m-MTDATA (for example, 4,4',4"-tris(-N-(3-methylphenyl)-N-phenylamino)triphenylamine). As an organic material forming the electron transport layer 6, there can be used a silole derivative or a cyclopentadiene derivative.

The light-emitting layer 7 has a base material containing a dopant. As an organic material forming the base material, there can be used a quinolinol aluminum complex or DPVBi (for example, 4,4'-bis(2,2'-diphenylvinyl)biphenyl).

Further, as a metal material forming the metal thin film layer 4, there can be employed Al, Mg, In, Ag, In—Li, Mg—Sr, Al—Sr, or the like.

In the organic EL device configured as above, when a voltage is applied between the ITO film 2 as an anode and the metal thin film layer 4 as a cathode, holes from the ITO film 2 reach the light-emitting layer 7 via the hole transport layer 5, while electrons from the metal thin film layer 4 reach the light-emitting layer 7 via the electron transport layer 6, whereupon the holes and the electrons are recombined in the light-emitting layer 7 to emit almost all light in a direction indicated by an arrow "A".

In the present embodiment, the characteristics of the ITO film 2 are set such that the work function is 4.9 to 5.5 eV, the surface roughness is 1 to 10 nm, and the specific resistance is $1.0 \times 10^{-4}$ to $1.6 \times 10^{-4}$ $\Omega \cdot cm$. Further, the ITO film 2 set as above can be formed easily on the surface of the glass substrate 1 by an ion plating method by using a sintered compact of ITO set to have an $SnO_2$ content of 4 to 6 wt % as a film-forming tablet (material to be vaporized).

In the following, the reasons for setting the work function, the surface roughness, the specific resistance, and the $SnO_2$ content to the above respective ranges will be described in detail.

(1) Work Function

Holes are injected into the light-emitting layer 7 from the ITO film 2 via the hole transport layer 5. To reduce the driving voltage of the organic EL device, it is required to increase the hole injection efficiency. To this end, the energy barrier between the ITO film 2 and the hole transport layer 5 has to be minimized. More specifically, the organic material, such as triphenyldiamine, which is employed as the hole transport layer 5, normally has an ionization potential Ip of 5.5 to 5.6 eV. Therefore, it is necessary to increase the work function of the ITO film 2 to a value closer to the ionization potential Ip of 5.5 to 5.6 eV of the hole transport layer 5. To increase the hole injection efficiency to thereby realize a desired lower driving voltage (e.g. 20V or less), the energy barrier between the ITO film 2 and the hole transport layer 5 has to be lowered to a level of 0.7 eV or less. To meet this requirement, in the present embodiment, the work function of the ITO film 2 is set to 4.9 to 5.5 eV.

(2) Surface Roughness

If the ITO film 2 has a remarkably rough or uneven surface, an electric field is concentratedly applied to protruding portions of the surface. This causes a slight discharge to occur at the protruding portions, and therefore makes the device prove to a breakdown to form dark points from which light is no longer emitted, resulting in degraded durability of the organic EL device. Therefore, to maintain excellent light-emitting properties and durability of the device, the surface roughness of the ITO film 2 has to be minimized. To this end, in the present embodiment, the surface roughness is set to 1 to 10 nm while taking productivity into consideration.

(3) Specific Resistance

Since the organic EL device is a current driven device, it is susceptible in electrical power consumption and display quality to the wiring resistance. Therefore, to realize a low power consumption and an excellent display quality, it is preferable that the ITO film 2 as the anode has a small resistance, and therefore the specific resistance of the ITO film 2 has to be minimized. More specifically, when the specific resistance of the ITO film 2 exceeds $1.6 \times 10^{-4}$ $\Omega \cdot cm$, increased power loss is caused by the wiring resistance, resulting in increased power consumption and degraded display quality. On the other hand, it is technically difficult to set the specific resistance of the ITO film 2 to a value $1.0 \times 10^{-4}$ $\Omega \cdot cm$ or less. Therefore, in the present embodiment, the specific resistance of the ITO film 2 is set to $1.0 \times 10^{-4}$ to $1.6 \times 10^{-4}$ $\Omega \cdot cm$.

(4) $SnO_2$ Content of ITO Sintered Compact

To set the work function, surface roughness, and specific resistance of the ITO film 2 to respective values within the above ranges, it is required to form an ITO film 2 on the glass substrate 1 by using the ion plating method. In this process, the $SnO_2$ content of the ITO sintered compact as film-forming tablet, that is, the ratio of $SnO_2/ITO$ is an important factor in attaining the above goals.

More specifically, if the ratio of $SnO_2/ITO$ is smaller than 4 wt %, although the work function is then increased, the resulting specific resistance exceeds $1.6 \times 10^{-4}$ $\Omega \cdot cm$, which results in increased power consumption and degraded display quality. On the other hand, also if the ratio of $SnO_2/ITO$ is larger than 6 wt %, the resulting specific resistance exceeds the above $1.6 \times 10^{-4}$ $\Omega \cdot cm$. Furthermore, in this case, the work function is also lowered, and hence the energy barrier between the ITO film 2 and the hole transport layer 5 is increased to increase the driving voltage as well. Therefore, in the present embodiment, the ratio of $SnO_2/ITO$ is set to 4 to 6 wt %.

Next, the method of forming the above ITO film 2 on the glass substrate 1 will be described.

Figure 2:
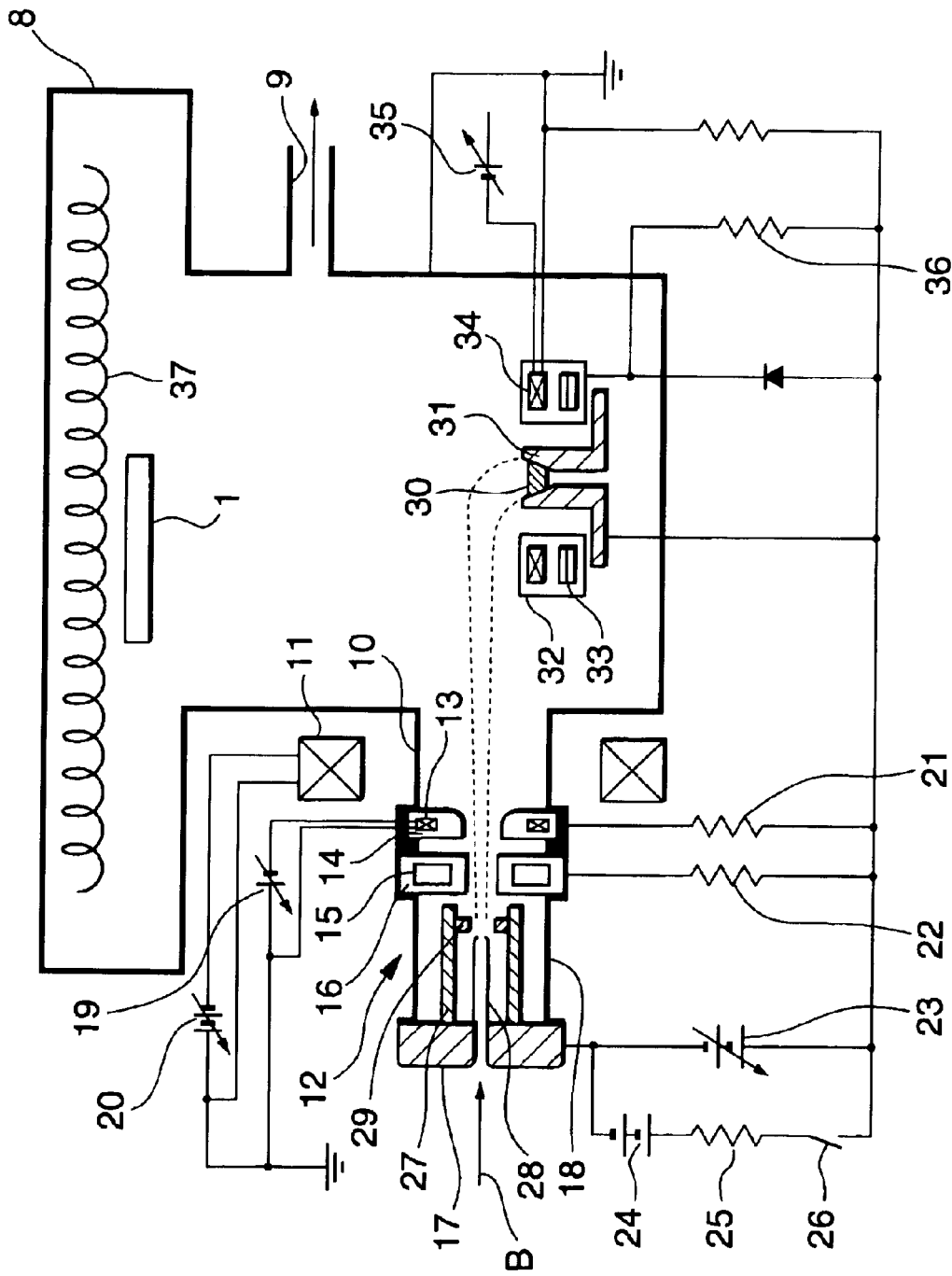
FIG. 2 is a diagram schematically showing the internal construction of an ion plating apparatus used to manufacture a substrate with a transparent conductive film for use in the organic EL device according to the present invention.

FIG. 2 is a diagram schematically showing an internal construction of an ion plating apparatus which is used for producing the substrate with a transparent conductive film.

In the figure, a vacuum vessel 8 serving as a film-forming chamber has one side wall formed with an exhaust port 9, and an opposite side wall formed with a hollow cylindrical portion 10. The hollow cylindrical portion 10 has a plasma gun 12 of a pressure gradient type mounted therein, and a convergence coil 11 wound around the outer periphery of the portion 10.

The plasma gun 12 is comprised of a second intermediate electrode 14 containing an electromagnetic coil 13 and connected to the hollow cylindrical portion 10, a first intermediate electrode 16 containing an annular permanent magnet 15 and arranged in parallel with the second intermediate electrode 14, a cathode 17, and a hollow cylindrical glass tube 18 interposed between the cathode 17 and the first intermediate electrode 16.

The electromagnetic coil 13 is excited by a power supply 19, while the convergence coil 11 is excited by a power supply 20. It should be noted that the power supplies 19 and 20 are both variable power supplies.

The second and first intermediate electrodes 14 and 16 are connected to one end (positive side) of a main power supply 23 of a variable voltage type via respective dropping resistors 21 and 22. The other end (negative side) of the main power supply 23 is connected to the cathode 17. Further, an auxiliary discharge power supply 24 and a dropping resistor 25 are connected in parallel with the main power supply 23 via a switch 26.

The glass tube 18 contains a hollow cylindrical member 27 which is made of Mo (molybdenum) and rigidly fixed to the cathode 17, a pipe 28 made of Ta (tantalum), and a disk-shaped member 29 which is made of LaB6 and rigidly fixed to the hollow cylindrical member 27 at a location in front of the pipe 28. A discharge gas (e.g. argon gas with a predetermined oxygen content) is fed into the plasma gun 12 through the pipe 28 from a direction indicated by an arrow "B".

The vacuum vessel 8 contains a main hearth 31 arranged on the bottom thereof for receiving an ITO sintered compact 30 as a film-forming tablet. The main hearth 31 has an auxiliary hearth 32 arranged along a periphery thereof. The main hearth 31 is made of an electrically-conductive material having an excellent thermal conductivity, such as copper, and has a recess for receiving plasma beams from the plasma gun 12. Further, the main hearth 31 is connected to the positive side of the main power supply 23 to form an anode for attracting the plasma beams.

Similarly to the main hearth 31, the auxiliary hearth 32 as well is made of an electrically-conductive material having an excellent thermal conductivity, such as copper. The auxiliary hearth 32 accommodates an annular permanent magnet 33 and an electromagnet 34 that is excited by a hearth coil power supply 35 which is a variable power supply. More specifically, the auxiliary hearth 32 has an annular vessel surrounding the main hearth 31, with the annular permanent magnet 33 and the electromagnet 34 coaxially laminated therein, and the electromagnet 34 is connected to the hearth coil power supply 35, such that a magnetic field generated by the annular permanent magnet 33 and a magnetic field generated by the electromagnet 34 overlap each other. In this case, the direction of a center-side magnet field generated by the annular permanent magnet 33, and the direction of a center-side magnet field generated by the electromagnet 34 are identical. By changing the voltage of the hearth coil power supply 35, a current supplied to the electromagnet 34 can be varied.

Further, similarly to the main hearth 31, the auxiliary hearth 32 as well is connected to the positive side of the main power supply 23 via a dropping resistor 36 to form an anode.

A heater 37 is arranged at a top portion of the vacuum vessel 8, for heating the glass substrate 1 to a predetermined temperature.

In the ion plating apparatus constructed as above, the ITO sintered compact 30 with an $SnO_2$ content of 4 to 6 wt % is placed in the recess of the main hearth 31, and a discharge gas is supplied to the pipe 28 from the cathode 17 side of the plasma gun 12, Then, a discharge occurs between the pipe 28 and the main hearth 31 to thereby generate a plasma beam. This plasma beam is converged by the annular permanent magnet 15 and the electromagnetic coil 13, and guided by a magnetic field which is defined by the convergence coil 11 as well as the annular permanent magnet 33 and the electromagnet 34 in the auxiliary hearth 32 to reach the main hearth 31.

The ITO sintered compact 30 in the main hearth 31 is heated by the plasma beam to be vaporized. Particles formed by the vaporization are ionized by the plasma beam and deposited onto the surface of the glass substrate 1 heated by the heater 37. Thus, the ITO film 2 is formed on the glass substrate 1.

EXAMPLES

Next, Examples of the present invention will be described in detail.

The present inventors prepared substrates with transparent conductive films by the ion plating method, by using five types of ITO sintered compacts which are different in $SnO_2$ content from each other.

More specifically, the ITO sintered compacts that have $SnO_2$ contents of 4 to 6 wt % which are within the range of the invention were used as film-forming tablets, and ITO films 2 having a thickness of 150 nm were formed on glass substrates 1 by the ion plating method under the following discharge conditions, thereby producing three types of test pieces (Examples 1 to 3).

[Discharge Conditions]

Discharge gas: $Ar+O_2$

Discharge current: 200A

Pressure within
the vacuum vessel: $2.66 \times 10^{-1}$ Pa ($2.0 \times 10^{-3}$ Torr)

Partial pressure of
oxygen in discharge gas: $2.66 \times 10^{-2}$ Pa ($2.0 \times 10^{-4}$ Torr)

Temperature of glass substrate 1: 200° C.

Further, by using ITO sintered compacts that have $SnO_2$ contents of 3 wt % and 10 wt % as film-forming tablets, under the same discharge condition as in the above Examples 1 to 3, ITO films 2 having a thickness of 150 nm were formed on glass substrates 1, thereby producing two types of test pieces (Comparative Examples 1, 2).

Next, by using an ITO sintered compact with a $SnO_2$ contents of 10 wt % as a film-forming target, sputtering was carried out by means of a DC sputtering apparatus under the following conditions, to form an ITO film 2 with a thickness of 150 nm on a glass substrate 1, thereby producing a test piece (Comparative Example 3).

[Sputtering Conditions]

Sputtering gas: $Ar+O_2$ (where $O_2$: 10 vol %)

Pressure of sputtering gas: 4×10⁻¹ Pa (3.0×10⁻³ Torr)

Power supply: 600W

Temperature of glass substrate: 200° C.

Further, triphenyldiamine having an ionization potential Ip of 5.6 eV was deposited onto a surface of each test piece to form a hole transport layer 5. Then, a quinolinol aluminum complex doped with quinacridone (approximately 0.5 wt %) was deposited onto a surface of the above hole transport layer, whereby a light-emitting layer 7 was formed. Further, a silole derivative was deposited onto the light-emitting layer 7 to thereby form an electron transport layer 6, and finally, aluminum was deposited onto the electron transport layer 6 to form a metal thin film layer 4, whereby an organic EL device was produced.

It should be noted that each of the above-mentioned hole transport layer 5, light-emitting layer 7, electron transport layer 6, and metal thin film layer 4 was formed by a vacuum deposition method well known in the art, such that the hole transport layer 5, the light-emitting layer 7, the electron transport layer 6, and the metal thin film layer 4 had respective film thicknesses of 5 nm, 7 nm, 40 nm, and 40 nm.

Then, as to each test piece 2, the work function, specific resistance, surface roughness of a surface of the ITO film 2, and the driving voltage of the test piece 2 as an organic EL device were measured.

Table 1 shows the values of characteristics (work function, specific resistance, surface roughness) of the ITO films 2, and the driving voltages of the respective organic EL devices. Further, the energy barrier of each test piece 2 was calculated by subtracting the ionization potential Ip (5.6 eV) of the hole transport layer 5 from the work function of the ITO film 2.

Further, Comparative Example 2 has a small surface roughness of 6 nm. This prevents occurrence of local concentration of electric field on the surface of the ITO film 2 and ensures excellent durability. However, since the ITO film 2 was formed by using the ITO sintered compact with a $SnO_2$ content of 10 wt %, it shows a reduced work function of 4.8 eV. This causes the ITO film 2 to have an increased energy barrier of 0.8 eV, and hence an increased driving voltage of 23 V. Moreover, similarly to Comparative Example 1, the film has an increased specific resistance of 1.90×10⁻⁴ Ω·cm, causing an increased wiring resistance. It was also found that Comparative Example 2 has increased power consumption and degraded display quality.

Still further, in the case of Comparative Example 3, since the ITO film 2 was formed by using the ITO sintered compact with a $SnO_2$ content of 10 wt %, and sputtering was carried out with the temperature of the substrate set to a relatively low temperature of 200° C., similarly to the ion plating method, Comparative Example 3 shows a high work function and hence necessitates a higher driving voltage. Further, Comparative Example 3 has an increased surface roughness of 32 nm, which causes a local concentration of electrical field on protruding portions of the surface, so that a breakdown of the device is liable to occur and hence the durability is degraded. Further, Comparative Example 3 shows a high specific resistance, which results in increased power consumption and degraded display quality.

In contrast, Examples 1 to 3 have ITO films with $SnO_2$ contents of 4 to 6 wt %, so that they have work functions of 4.9 to 5.5 eV, surface roughnesses of 6 to 8 nm, and specific resistances of 1.6×10⁻⁴ Ω·cm or less. This makes it possible to reduce the driving voltage to 20 V or less, enhance the smoothness and durability, and realize low power consump-

TABLE 1

|  |  | $SnO_2$/ITO (wt %) | Work function (eV) | Surface roughness (nm) | Specific resistance (×10⁻⁴ Ω·cm) | Energy barrier (eV) | Driving voltage (V) | Evaluation |
| --- | --- | --- | --- | --- | --- | --- | --- | --- |
| Example | 1 | 6 | 4.9 | 8 | 1.5 | 0.7 | 20 | ○ |
|  | 2 | 5 | 5.2 | 7 | 1.3 | 0.4 | 17 | ○ |
|  | 3 | 4 | 5.5 | 6 | 1.6 | 0.1 | 10 | ○ |
| Comparative Example | 1 | 3* | 5.6 | 7 | 1.9* | 0 | 8 | X |
|  | 2 | 10* | 4.8* | 6 | 1.9* | 0.8* | 23* | X |
|  | 3 | 10* | 4.7* | 32* | 1.7* | 0.9* | 25* | X |

(note: the asterisked values are not within the range of the present invention)

In Table 1, the work function was measured by using "Surface Analysis Apparatus AC-1" manufactured by Riken Keiki Co., Ltd. The specific resistance was calculated by measuring sheet resistance by a four-probe method. The surface roughness was calculated by measuring irregularities on an area of 1 $\mu m^2$ of the surface of each test piece by using an atomic force microscope "SPM3700" manufactured by Seiko Instruments Inc. Further, the driving voltage was calculated by measuring voltages obtained when a current of 0.01 A/cm² flowed through the test pieces.

As is clearly shown in Table 1, Comparative Example 1 has a high work function of 5.6 eV and an energy barrier of 0 eV, and hence shows a low driving voltage of 8 V and a small surface roughness of 7 nm. Therefore, there occurs no local concentration of electric field on the surface of the ITO film 2, and the film has an excellent durability. However, since the ITO film 2 was formed by using the ITO sintered compact with a $SnO_2$ content of 3 wt %, it shows an increased specific resistance of 1.9×10⁻⁴ Ω·cm and hence an increased wiring resistance (power loss). Therefore, it was found that Comparative Example 1 has increased power consumption and degraded display quality.

tion and high display quality. As a result, it is possible to satisfy all the requirements of characteristics demanded of the organic EL device.

What is claimed is:

1. A substrate with a transparent conductive film, comprising:

a transparent substrate, and a transparent conductive film formed on a surface of said transparent substrate; and a hole transport layer laminated on a surface of said transparent conductive film, wherein said transparent conductive film has a work function of 4.9 to 5.5 eV, a surface roughness of 1 to 10 nm, and a specific resistance of 1.6×10⁻⁴ Ω·cm or less, wherein said transparent conductive film is formed on the surface of said transparent substrate by an ion plating method by using indium tin oxide which is a mixture of tin oxide and indium oxide as a material to be vaporized, wherein said indium tin oxide has a tin oxide content of 4 to 6 wt %, and wherein an energy barrier between said transparent conductive film and said hole transport layer is equal to or smaller than 0.7 eV.

2. An organic electroluminescence device comprising:

a substrate with a transparent conductive film, including a transparent substrate, and a transparent conductive film formed on a surface of said transparent substrate, wherein said transparent conductive film has a work function of 4.9 to 5.5 eV, a surface roughness of 1 to 10 nm, and a specific resistance of $1.6\times10^{-4}$ Ω·cm or less, and a multilayer film including a hole transport layer formed of an organic material, said multilayer film being laminated on a surface of said transparent conductive film of said substrate with said transparent conductive film, wherein an energy harrier between said transparent conductive film and said hole transport layer is equal to or smaller than 0.7 eV.

3. An organic electroluminescence device according to claim 2, wherein said multilayer film further comprises a light-emitting layer laminated on said hole transport layer, and an electron transport layer laminated on said light-emitting layer.

4. A method of producing a substrate with a transparent conductive film, comprising:

providing a transparent substrate;

ion plating a transparent conductive film on a surface of said transparent substrate by using indium tin oxide which is a mixture of tin oxide and indium oxide as a material to be vaporized; and laminating a hole transport layer on a surface of said transparent conductive film, wherein said indium tin oxide has a tin oxide content of 4 to 6 wt %, wherein the transparent conductive film has a work function of 4.9 to 5.5 eV, a surface roughness of 1 to 10 nm and a specific resistance of $1.6\times10^{-4}$ Ω·cm or less, and wherein an energy barrier between said transparent conductive film and said hole transport layer is equal to or smaller than 0.7 eV.

* * * * *